(12) United States Patent
Watanabe et al.

(10) Patent No.: US 6,489,653 B2
(45) Date of Patent: Dec. 3, 2002

(54) LATERAL HIGH-BREAKDOWN-VOLTAGE TRANSISTOR

(75) Inventors: Kiminori Watanabe, Kawasaki (JP); Keisuke Matsuoka, Fukuoka (JP); Takao Ito, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/746,223

(22) Filed: Dec. 26, 2000

(65) Prior Publication Data

US 2001/0015459 A1 Aug. 23, 2001

(30) Foreign Application Priority Data

Dec. 27, 1999 (JP) .......................................... 11-371568
Jul. 6, 2000 (JP) ...................................... 2000-205070

(51) Int. Cl.⁷ .............................................. H01L 29/78
(52) U.S. Cl. ...................... 257/343; 257/341; 257/394
(58) Field of Search .............................. 257/343, 341, 257/394

(56) References Cited

U.S. PATENT DOCUMENTS 4,589,004 A * 5/1986 Yasuda et al. ............... 257/337
6,194,761 B1 * 2/2001 Chiozzi et al. ............. 257/328

OTHER PUBLICATIONS

J.A. Appels, et al., High Voltage Thin Layer Devices (Resurf Devices), Philips Research Labotatories, Proc. IEDM, pp. 238–241, (1979).

* cited by examiner

*Primary Examiner*—Jerome Jackson
(74) *Attorney, Agent, or Firm*—Finnegan, Henderson, Farabow, Garrett & Dunner, L.L.P.

(57) ABSTRACT

A lateral high-breakdown-voltage transistor comprises an n⁻ drain region and an n⁺ source region formed in a p⁻ silicon substrate, separated from each other, a gate electrode formed on a channel, insulated from the substrate, an n⁺ drain contact region formed in the drain region, drain wiring electrically connected to the drain region via the drain contact region, a p⁺ substrate contact region formed in contact with the source region, and source wiring electrically connected to the source region and also connected to the semiconductor layer via the substrate contact region. The transistor is characterized in that the substrate contact regions have respective portions made to be in contact with the source wiring, and accordingly laterally extend from inside the contact surface of the source wiring to outside the contact surface.

7 Claims, 14 Drawing Sheets

LATERAL HIGH-BREAKDOWN-VOLTAGE TRANSISTOR

CROSS-REFERENCE TO RELATED APPLICATIONS

This application is based upon and claims the benefit of priority from the prior Japanese Patent Applications No. 11-371568, filed Dec. 27, 1999; and No. 2000-205070, filed Jul. 6, 2000, the entire contents of which are incorporated herein by reference.

BACKGROUND OF THE INVENTION

This invention relates to a lateral high-breakdown-voltage transistor.

The lateral high-breakdown-voltage MOS transistor is a type of a power MOS transistor, which is switched on when a voltage ranging from several tens to several hundreds volts is applied thereto.

FIG. 13A is an enlarged plan view illustrating part of the planar pattern of a conventional lateral high-breakdown-voltage MOS transistor. FIG. 13B is a sectional view taken along line 13B—13B of FIG. 13A. In FIG. 13A, the gate electrode of the transistor is omitted.

As shown in FIGS. 13A and 13B, a low-concentration n⁻ drain region 102 is formed in a low-concentration p⁻ silicon substrate 101, and a high-concentration n⁺ source region 103 is formed therein, separated from the drain region 102. A gate electrode 105 is formed on that portion of the substrate 101, which is located between the drain and source regions 102 and 103, i.e. on a channel 104, such that the electrode 105 is electrically isolated from the substrate 101.

An n⁺ drain contact region 106 having a higher impurity concentration than the drain region 102 is formed in the drain region 102. The drain contact region 106 is sufficiently separated from the channel 104 by means of a field insulating film 108 formed on the substrate 101. The field insulating film 108 is made of, for example, silicon dioxide, and formed by the LOCOS (Local Oxidation of Silicon) technique, or STI (Shallow Trench Isolation) technique, etc. Further, high-concentration p⁺ substrate contact regions 107 are formed in the substrate 101 in contact with the source region 103.

An interlayer insulating film 109 made of, for example, silicon dioxide is formed on the field insulating film 108 and on those portions of the substrate 101, in which the aforementioned semiconductor regions are formed. The interlayer insulating film 109 has a contact hole 110 that exposes the drain contact region 106 therethrough, and a contact hole 111 that exposes the source region 103 and the substrate contact regions 107 therethrough. Drain wiring 112 is provided on the interlayer insulating film 109 such that it comes into contact with the drain contact region 106 via the contact hole 110. Similarly, source wiring 113 is provided on the interlayer insulating film 109 such that it comes into contact with the source region 103 and the substrate contact regions 107 via the contact hole 111. The drain wiring 112 is electrically connected to the drain region 102 via the drain contact region 106. In FIG. 13A, reference numeral 116 denotes a contact surface between the drain wiring 112 and the drain contact region 106. The source wiring 113 is electrically connected to the source region 103, and also to the substrate 101 via the substrate contact regions 107. Further, in FIG. 13A reference numeral 115 denotes a contact surface between the source wiring 113 and the source region 103, the substrate contact regions 107.

Since, in the lateral high-breakdown-voltage MOS transistor, the drain and source regions 102 and 103 exist at the same level as shown in FIG. 13A, a lateral parasitic bipolar transistor exists which uses the drain region 102, the substrate 101 and the source region 103 as a collector, a base and an emitter, respectively. When the lateral parasitic bipolar transistor is turned on, it adversely affects the operation of the MOS transistor. The lateral parasitic bipolar transistor is turned on, for example, in the following situation.

When the gate is turned on and the voltage at the drain is increased, avalanche breakdown starts at a curved surface 114 of the drain contact region 106, whereby a hole current flows toward the substrate 101. This hole current flows below the source region 103 to the substrate contact regions 107, and then, usually, to the source wiring 113 via substrate contact regions 107.

When the voltage at the drain is further increased, the level of the avalanche breakdown increases to thereby increase the hole current. As the hole current increases, a high voltage is generated due to the resistance of a portion of the substrate 101 below the source region 103. Accordingly, forwardly biasing of the PN junction between the substrate 101 and the source region 103 occurs, thereby turning on the lateral parasitic bipolar transistor. When the lateral parasitic bipolar transistor is turned on, control using the gate cannot be executed, resulting in breakdown of the lateral high-breakdown-voltage MOS transistor.

BRIEF SUMMARY OF THE INVENTION

The present invention has been developed to solve the above-described problem, and aims to provide a lateral high-breakdown-voltage transistor capable of suppressing turn-on of a lateral parasitic bipolar transistor and hence having a higher breakdown voltage.

According to a first aspect of the invention, there is provided a semiconductor device having a lateral high-breakdown-voltage transistor comprising: a first-conductivity-type semiconductor layer; a second-conductivity-type source region formed in the semiconductor layer; a second-conductivity-type drain region formed in or outside the semiconductor layer, separated from the source region; a gate electrode formed above the semiconductor layer between the drain region and the source region, insulated from the semiconductor layer; a second-conductivity-type drain contact region formed in the drain region and having a higher impurity concentration than the drain region; a drain wiring electrically connected to the drain region via the drain contact region; a first-conductivity-type substrate contact region formed adjacent to the source region; and a source wiring electrically connected to the source region, and also connected to the semiconductor layer via the substrate contact region. This transistor is characterized in that the source wiring touches a portion of the source region and the substrate contact region, thereby forming a contact surface therebetween, and the substrate contact region laterally extend from inside the contact surface to outside the contact surface.

Since, in the semiconductor device having the lateral high-breakdown-voltage transistor according to the first aspect, the substrate contact region extend from inside the contact surface of the source wiring to outside the contact surface, the ratio of the contact area of the substrate contact regions and the source wiring to their non-contact area can be increased as compared with the conventional case. As a result, a hole current flowing in the semiconductor layer can easily flow to the source wiring, which makes it difficult to turn on the lateral parasitic bipolar transistor. This enables production of a lateral high-breakdown-voltage transistor of a higher breakdown voltage.

According to a semiconductor device having a second aspect of the invention, there is provided a lateral high-breakdown-voltage transistor comprising: a first-conductivity-type semiconductor layer; a second-conductivity-type source region formed in the semiconductor layer; a second-conductivity-type drain region formed in or outside the semiconductor layer, separated from the source region; a gate electrode formed above the semiconductor layer between the drain region and the source region, insulated from the semiconductor layer; a second-conductivity-type drain contact region formed in the drain region and having a higher impurity concentration than the drain region; a drain wiring electrically connected to the drain region via the drain contact region; a first-conductivity-type substrate contact region formed adjacent to the source region; and a source wiring electrically connected to the source region, and also connected to the semiconductor layer via the substrate contact region. This transistor is characterized by further comprising a first-conductivity-type low resistance layer, which is formed in the semiconductor layer in contact with a bottom of the source region and has a higher impurity concentration than the semiconductor layer.

Since, the semiconductor device having the lateral high-breakdown-voltage transistor according to the second aspect further comprises a first-conductivity-type low resistance layer formed in the semiconductor layer in contact with a bottom of the source region and having a higher impurity concentration than the semiconductor layer, the resistance of the device below the source region can be reduced as compared with the conventional case. As a result, a voltage that is generated when the hole current passes below the source region is reduced, thereby making it difficult to turn on the lateral parasitic bipolar transistor. This enables production of a lateral high-breakdown-voltage transistor of a higher breakdown voltage.

According to a third aspect of the invention, there is provided a semiconductor device having a lateral high-breakdown-voltage transistor comprising: a first-conductivity-type semiconductor layer; a second-conductivity-type source region formed in the semiconductor layer; a second-conductivity-type drain region formed in or outside the semiconductor layer, separated from the source region; a gate electrode formed above the semiconductor layer between the drain region and the source region, insulated from the semiconductor layer; a second-conductivity-type drain contact region formed in the drain region and having a higher impurity concentration than the drain region; a drain wiring electrically connected to the drain region via the drain contact region; a first-conductivity-type substrate contact region formed adjacent to the source region; and a source wiring electrically connected to the source region, and also connected to the semiconductor layer via the substrate contact region. This transistor is characterized in that a distance from a contact surface of the drain wiring and the drain contact region to an edge of the source region side of the drain contact region is 5 μm or more.

In the semiconductor device having the lateral high-breakdown-voltage transistor according to the third aspect, the distance from the contact surface of the drain wiring and the drain contact region to the edge of the drain contact region is set at a value that causes a portion extending from the contact surface to the edge of the drain contact region to have a resistance of 10Ω. In other words, the distance from the contact surface of the drain wiring and the drain contact region to the edge of the drain contact region is set longer than in the conventional case. Accordingly, the level of the electric field applied to the edge of the drain contact region can be reduced as compared with the conventional case. Further, since the distance to the curved surface is longer than in the conventional case, avalanche breakdown, which concentrates on the curved surface in the conventional case, can be dispersed even to the bottom of the drain contact regions. The prevention of concentration of an electric field on the curved surface, and the dispersion of avalanche breakdown suppress the occurrence of strong avalanche breakdown. As a result, the hold current flowing in the semiconductor substrate is reduced, thereby making it difficult to turn on the lateral parasitic bipolar transistor. This enables production of a lateral high-breakdown-voltage transistor of a higher breakdown voltage.

According to a fourth aspect of the invention, there is provided a semiconductor device having a lateral high-breakdown-voltage transistor comprising: a first-conductivity-type semiconductor layer; a second-conductivity-type source region formed in the semiconductor layer; a second-conductivity-type drain region formed in or outside the semiconductor layer, separated from the source region; a gate electrode formed above the semiconductor layer between the drain region and the source region, insulated from the semiconductor layer; a second-conductivity-type drain contact region formed in the drain region and having a higher impurity concentration than the drain region; a drain wiring electrically connected to the drain region via the drain contact region; a first-conductivity-type substrate contact region formed adjacent to the source region; and a source wiring electrically connected to the source region, and also connected to the semiconductor layer via the substrate contact region. This transistor is characterized in that the drain contact region has a bottom at a level lower than a bottom of the drain region.

Since, in the semiconductor device having the lateral high-breakdown-voltage transistor according to the fourth aspect, the drain contact region reaches the semiconductor layer via the bottom of the drain region, the distance from the contact surface of the drain wiring and the drain contact region to the curved surface of the drain contact region is longer than in the conventional case. Accordingly, the level of the electric field applied to the curved surface can be reduced as compared with the conventional case, thereby reducing the level of avalanche breakdown that occurs at the curved surface. As a result, a hole current flowing in the substrate can easily flow to the source wiring, which makes it difficult to turn on the lateral parasitic bipolar transistor. This enables production of a lateral high-breakdown-voltage transistor of a higher breakdown voltage.

According to a fifth aspect of the invention, there is provided a semiconductor device having a lateral high-breakdown-voltage transistor comprising: a first-conductivity-type semiconductor substrate; a second-conductivity-type buried layer formed in the semiconductor substrate; a second-conductivity-type epitaxial layer formed on the buried layer; a first-conductivity-type well layer formed in a surface portion of the epitaxial layer; a second-conductivity-type source region formed in a surface portion of the well layer; a second-conductivity-type drain region formed in a surface portion of the epitaxial layer or the well layer, separated from the source region; a second-conductivity-type deep diffusion layer formed in the drain region but extending to a level lower than a bottom of the drain region in contact with the buried layer, and having a higher impurity concentration than the drain region; a gate electrode formed above the well layer between the drain region and the source region, insulated from the well layer; a first drain electrode formed on the deep diffusion layer and electrically connected to the drain region via the deep diffusion layer; a source electrode formed on and electrically connected to the source region; a second-conductivity-type isolating diffusion layer surrounding the drain region and the source region, separated from the well layer, and extending to the buried layer; and a second drain electrode formed on the isolating diffusion layer and electrically connected to the first drain electrode. This transistor is characterized in that a distance between the deep diffusion layer and the source region being greater than a thickness of the epitaxial layer on the buried layer.

In the semiconductor device having the lateral high-breakdown-voltage transistor according to the fifth aspect, a surge voltage, when it is applied thereto via the drain electrode, more easily flows in the direction of the thickness (i.e. in the vertical direction) than in the lateral direction. Accordingly, an electric field more concentrates in the vertical direction than in the lateral direction, thereby causing breakdown to occur in the buried layer. In other words, concentration of an electric field on the curved surface of the drain contact region reduces to thereby suppress breakdown in the lateral direction. As a result, concentration of an electric field is avoided, and hence the breakdown voltage of the transistor is enhanced. Moreover, since the deep diffusion layer is extended from the surface of the substrate in the drain region to the buried layer, a surge voltage, when it is applied to the drain electrode, is sufficiently absorbed therein, and therefore the adverse influence of the surge voltage is avoided. This being so, electric field concentration on the curved surface of the drain contact region is avoided, thereby increasing the breakdown voltage.

According to a sixth aspect of the invention, there is provided a semiconductor device having a lateral high-breakdown-voltage transistor comprising: a first-conductivity-type semiconductor substrate; a second-conductivity-type buried layer formed in the semiconductor substrate; a second-conductivity-type epitaxial layer formed on the buried layer; a first-conductivity-type well layer formed in a surface portion of the epitaxial layer; a second-conductivity-type source region formed in a surface portion of the well layer; a second-conductivity-type drain region formed in a surface portion of the well layer, separated from the source region; a second-conductivity-type drain contact region formed in a surface portion of the drain region and having a higher impurity concentration than the drain region; a gate electrode formed above the well layer between the drain region and the source region, insulated from the well layer; a first drain electrode formed on the drain contact region and electrically connected to the drain region via the drain contact region; a source electrode formed on and electrically connected to the source region; a second-conductivity-type isolating diffusion layer surrounding the well layer, separated from the well layer, and extending to the buried layer; and a second drain electrode formed on the isolating diffusion layer and electrically connected to the first drain electrode. This transistor is characterized in that a distance between the drain contact region and the source region being greater than a thickness of the epitaxial layer on the buried layer.

In the semiconductor device having the lateral high-breakdown-voltage transistor according to the sixth aspect, a surge voltage, when it is applied thereto via the drain electrode, more easily flows in the direction of the thickness (i.e. in the vertical direction) than in the lateral direction. Accordingly, an electric field more concentrates in the vertical direction than in the lateral direction, thereby causing breakdown to occur in the buried layer. In other words, concentration of an electric field on the curved surface of the drain contact region reduces to thereby suppress breakdown in the lateral direction. As a result, concentration of an electric field is avoided, and hence the breakdown voltage of the transistor is enhanced. Moreover, since, in the device, the drain region and the source region are formed in the well layer, the current path is prevented from extending to the epitaxial layer. Thus, the resistance of the element can be reduced.

As described above, the invention can provide a lateral high-breakdown-voltage transistor capable of suppressing the turn-on of the lateral parasitic bipolar transistor and hence having a higher breakdown voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
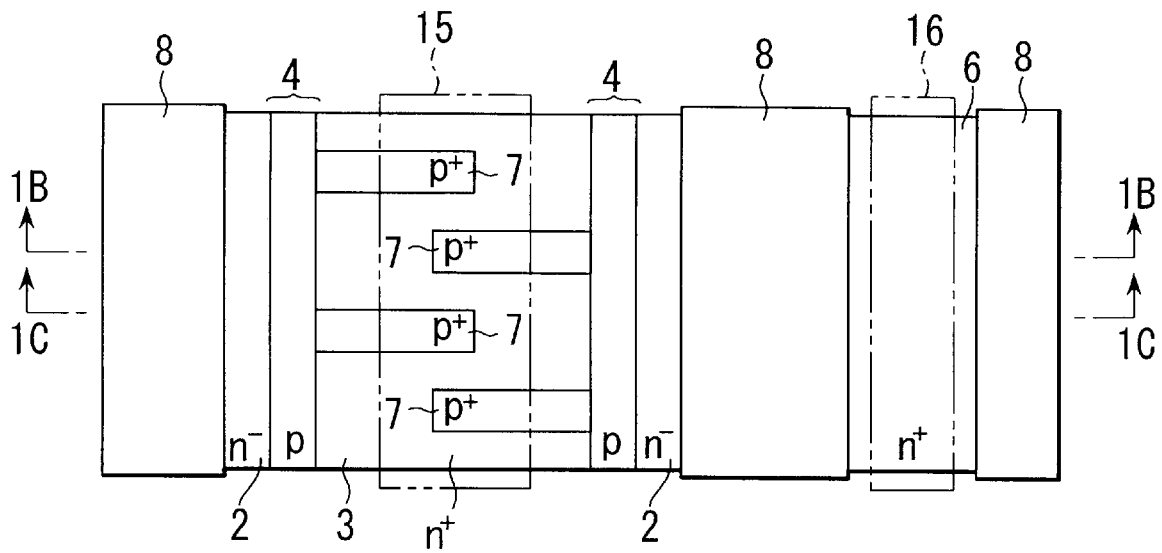
FIG. 1A is an enlarged plan view illustrating part of the planar pattern of a lateral high-breakdown-voltage MOS transistor according to a first embodiment of the invention.

Reference will now be made in detail to the presently preferred embodiments of the invention as illustrated in the accompanying drawings, in which like reference numerals designate like or corresponding parts throughout the drawings.

[First Embodiment]

Figure 1B:
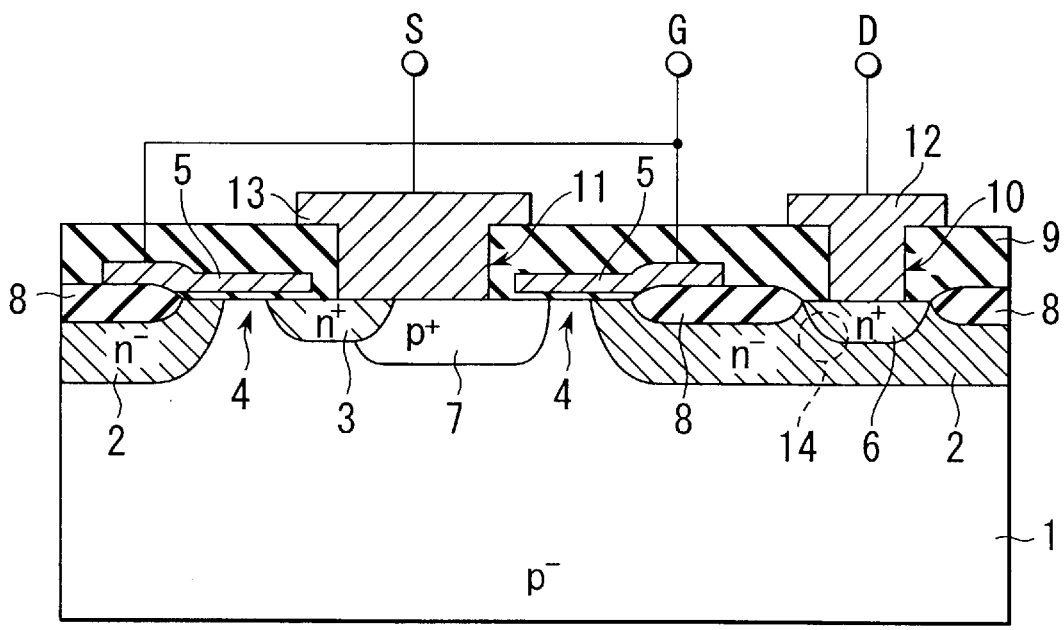
FIG. 1B is a sectional view taken along line 1B—1B of FIG. 1A.
Figure 1C:
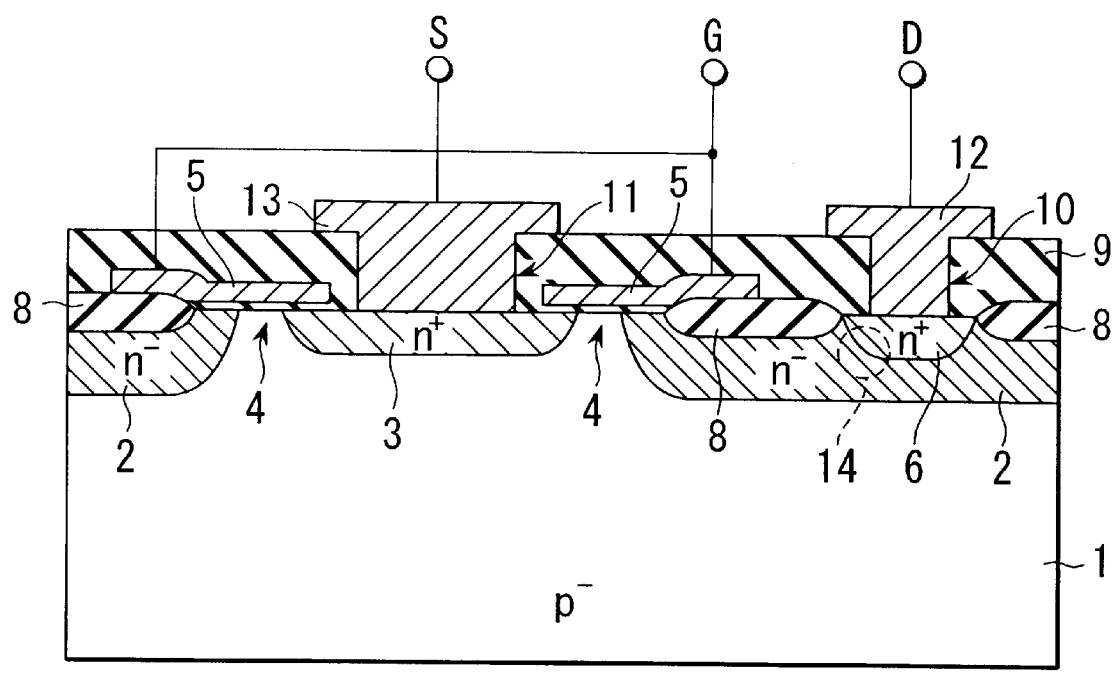
FIG. 1C is a sectional view taken along line 1C—1C of FIG. 1A.

FIG. 1A is an enlarged plan view illustrating part of the planar pattern of a lateral high-breakdown-voltage MOS transistor according to a first embodiment of the invention. FIG. 1B is a sectional view taken along line 1B—1B of FIG. 1A. FIG. 1C is a sectional view taken along line 1C—1C of FIG. 1A. In FIG. 1A, the gate electrode of the transistor is omitted.

As shown in FIGS. 1A–1C, a low-concentration n$^-$ drain region 2 is formed in a low-concentration p$^-$ silicon substrate or well 1, and a high-concentration n$^+$ source region 3 is formed therein, separated from the drain region 2. A gate electrode 5 is formed on that portion of the substrate 1, which is located between the drain and source regions 2 and 3, i.e. on a channel 4, such that the electrode 5 is electrically isolated from the substrate 1.

An n$^+$ drain contact region 6 having a higher impurity concentration and a lower resistance than the drain region 2 is formed in the drain region 2. The drain contact region 6 is sufficiently separated from the channel 4 by means of a field insulating film 8 formed on the substrate 1. The field insulating film 8 is made of, for example, silicon dioxide, and formed by the LOCOS (Local Oxidation of Silicon) technique, or STI (Shallow Trench Isolation) technique, etc. Further, high-concentration p$^+$ substrate contact regions 7 are formed in the substrate 1 in contact with the source region 3.

An interlayer insulating film 9 made of, for example, silicon dioxide is formed on the field insulating film 8 and on those portions of the substrate 1, in which the aforementioned semiconductor regions are formed. The interlayer insulating film 9 has a contact hole 10 that exposes the drain contact region 6 therethrough, and a contact hole 11 that exposes the source region 3 and the substrate contact regions 7 therethrough. Drain wiring 12 is provided on the interlayer insulating film 9 such that it comes into contact with the drain contact region 6 via the contact hole 10. Similarly, source wiring 13 is provided on the interlayer insulating film 9 such that it comes into contact with the source region 3 and the substrate contact regions 7 via the contact hole 11. The drain wiring 12 is electrically connected to the drain region 2 via the drain contact region 6. In FIG. 1A, reference numeral 16 denotes a contact surface between the drain wiring 12 and the drain contact region 6. The source wiring 13 is electrically connected to the source region 3, and also to the substrate 1 via the substrate contact regions 7. Further, in FIG. 1A reference numeral 15 denotes a contact surface between the source wiring 13 and the source region 3, the substrate contact regions 7.

In the first embodiment, the substrate contact regions 7 are extended from the inside to the outside of the contact surface 15, and preferably to the channel 4, as is shown in FIG. 1A. As a result, the ratio of the contact area of the source wiring 13 and the substrate contact regions 7 is higher than in the conventional MOS transistor shown in FIG. 13A, in which the substrate contact regions 107 are formed inside the contact surface 115 of the source wiring 113.

Since, in the first embodiment, the ratio of the contact area of the source wiring 13 and the substrate contact regions 7 is higher than in the conventional case, the hole current can flow to the source wiring 13 via the substrate contact region 7 more easily than in the conventional case.

Since thus, the hole current can flow to the source wiring 13 more easily, a lateral parasitic bipolar transistor, which uses the drain region 2, the substrate 1 and the source region 3 as a collector, a base and an emitter, respectively, is harder to turn on.

Figure 13A:
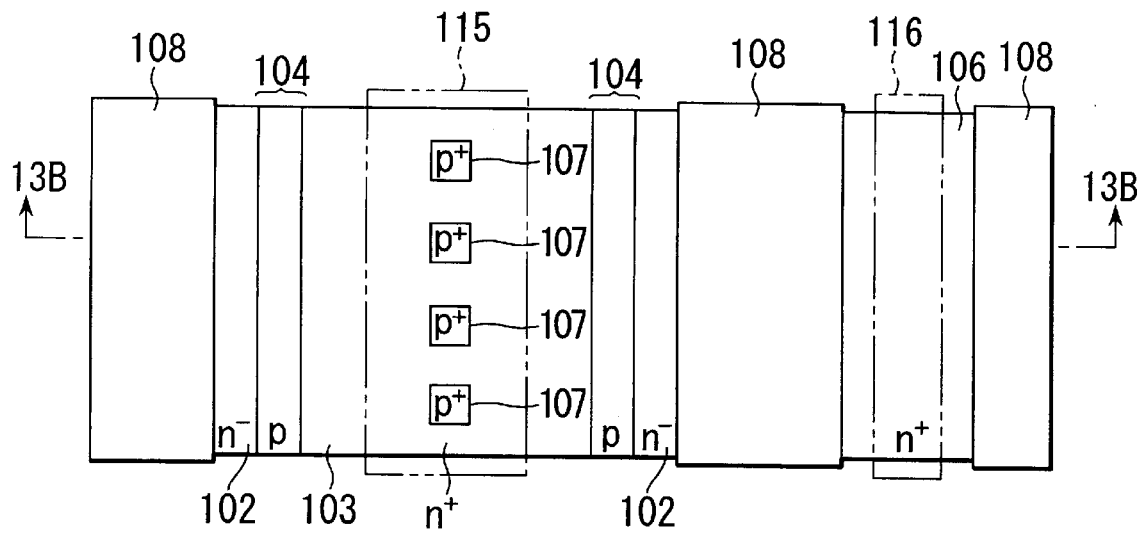
FIG. 13A is an enlarged plan view illustrating part of the planar pattern of a conventional lateral high-breakdown-voltage MOS transistor.
Figure 13B:
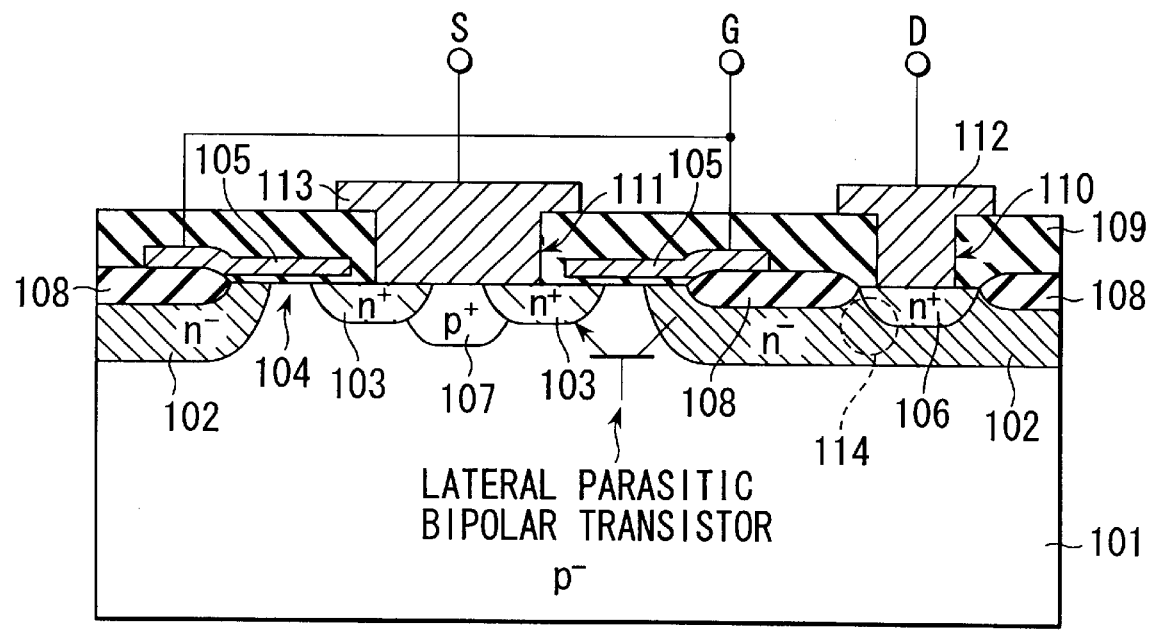
FIG. 13B is a sectional view taken along line 13B—13B of FIG. 13A.

Accordingly, the first embodiment provides a lateral MOS transistor having a higher breakdown voltage than the conventional lateral high-breakdown-voltage MOS transistor shown in FIGS. 13A and 13B.

Figure 1D:
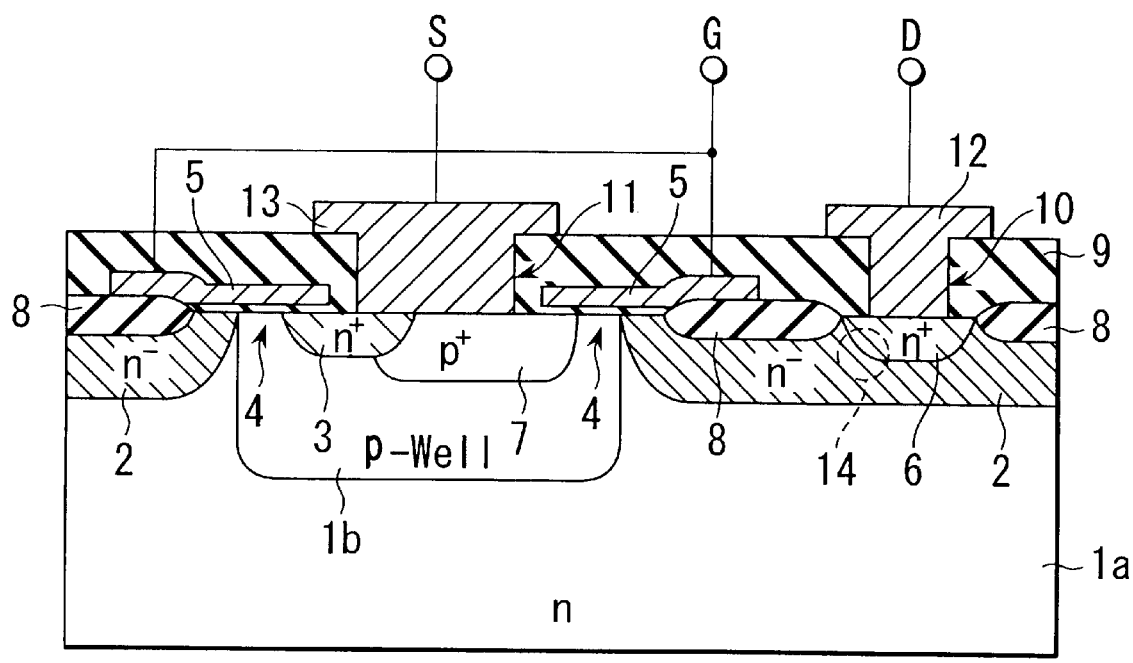
FIG. 1D is a sectional view illustrating a lateral high-breakdown-voltage MOS transistor according to a first embodiment of the invention.

The first embodiment is not limited to the above-described structure, but may have a structure as shown in FIG. 1D, in which a p-well 1b is formed in a surface portion of a low-concentration n silicon substrate 1a such as containing a channel 4 of either side of the p-well 1b, and an n$^+$ source region 3 and p$^+$ substrate contact regions 7 are formed in the p-well 1b. This structure can provide a similar advantage to that obtained by the above-described first embodiment.

[Second Embodiment]

A second embodiment is similar to the first embodiment except for that the planar pattern of the substrate contact regions 7 are improved.

Figure 2A:
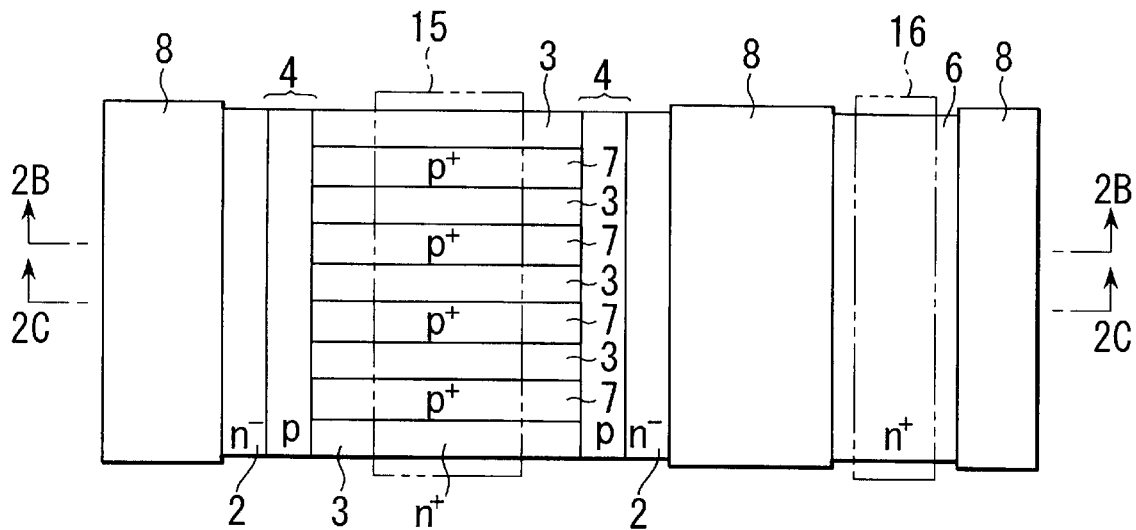
FIG. 2A is an enlarged plan view illustrating part of the planar pattern of a lateral high-breakdown-voltage MOS transistor according to a second embodiment of the invention.
Figure 2B:
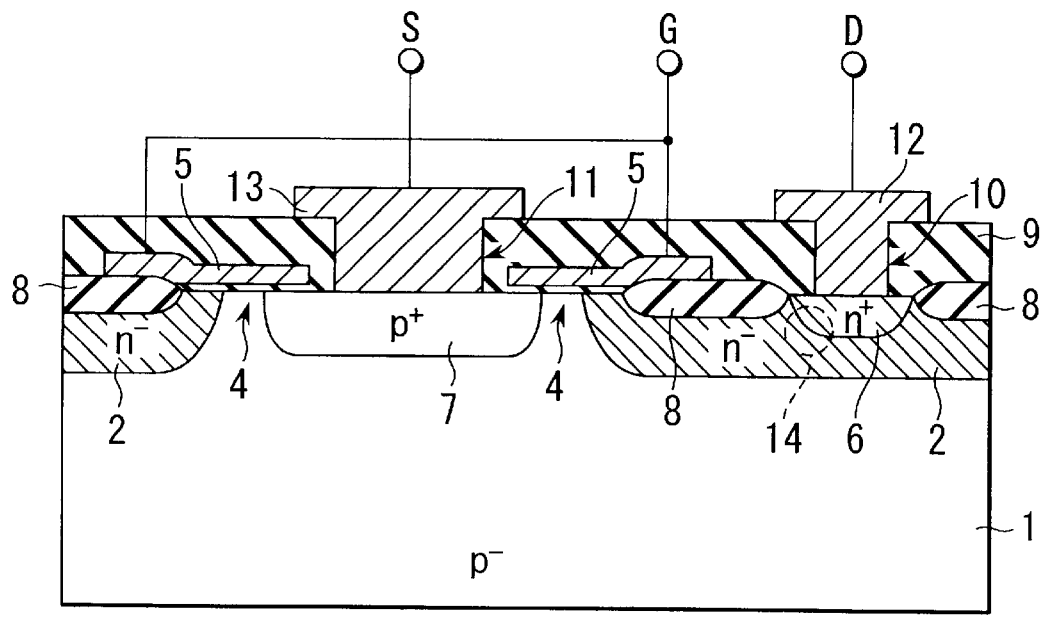
FIG. 2B is a sectional view taken along line 2B—2B of FIG. 2A.

FIG. 2A is an enlarged plan view illustrating part of the planar pattern of a lateral high-breakdown-voltage MOS transistor according to the second embodiment. FIG. 2B is a sectional view taken along line 2B—2B of FIG. 2A. FIG.

2C is a sectional view taken along line 2C—2C of FIG. 2A. In FIG. 2A, the gate electrode of the transistor is omitted.

Figure 2C:
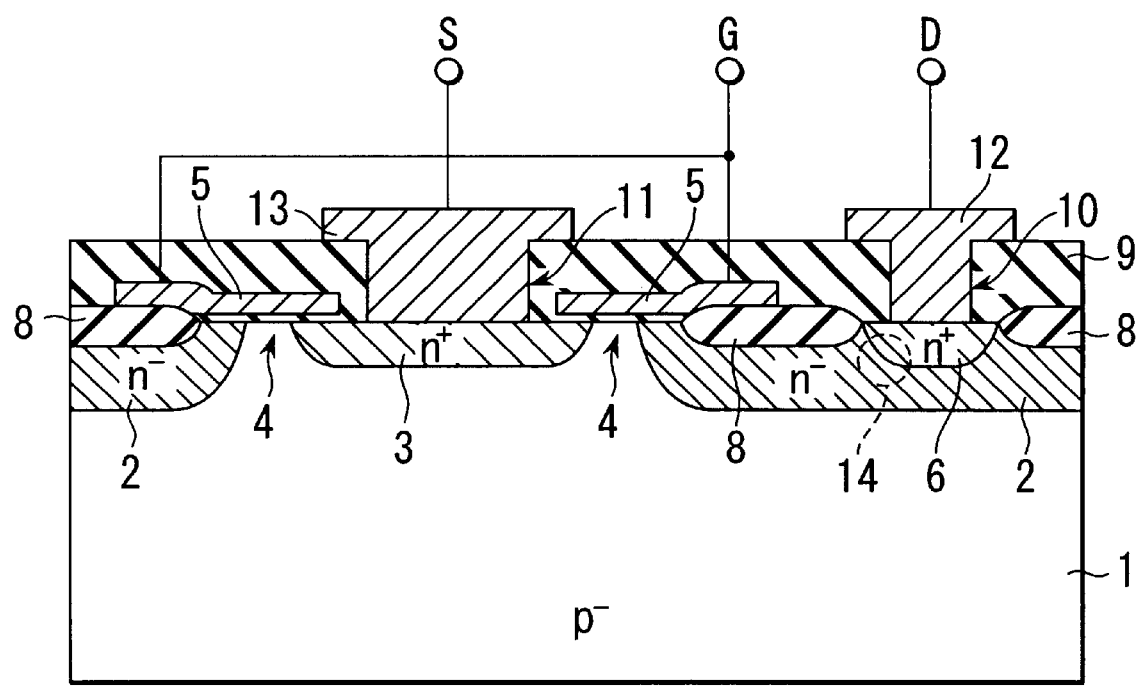
FIG. 2C is a sectional view taken along line 2C—2C of FIG. 2A.

As shown in FIGS. 2A–2C, the second embodiment differs from the first embodiment in the planar pattern of the substrate contact regions 7.

In the first embodiment, the substrate contact regions 7 are alternately extended to opposite portions of the channel 4. On the other hand, in the second embodiment, each of the substrate contact regions 7 is extended to both opposite portions of the channel 4.

By virtue of this structure, the ratio of the contact area of the source wiring 13 and the substrate contact regions 7 in the second embodiment is higher than in the first embodiment.

Accordingly, in the second embodiment, the hole current can flow to the source wiring 13 more easily, and a lateral parasitic bipolar transistor, which uses the drain region 2, the substrate 1 and the source region 3 as a collector, a base and an emitter, respectively, is harder to turn on.

Therefore, the second embodiment provides a lateral MOS transistor having a higher breakdown voltage than the first embodiment.

The second embodiment may be modified, like the modification of the first embodiment shown in FIG. 1D, such that a p-well $1b$ is formed in a surface portion of an n silicon substrate $1a$, and an $n^+$ source region 3 and $p^+$ substrate contact regions 7 are formed in the p-well $1b$.

[Third Embodiment]

In the first and second embodiments, the turn-on of the lateral parasitic bipolar transistor is suppressed by causing a hole current flowing in the substrate 1 to easily flow to the source wiring 13.

On the other hand, in a third embodiment, the turn-on of the lateral parasitic bipolar transistor is suppressed by reducing a voltage that occurs due to the resistance of a portion of the substrate 1 below the source region 3 when a hole current flows in the substrate 1.

Figure 3A:
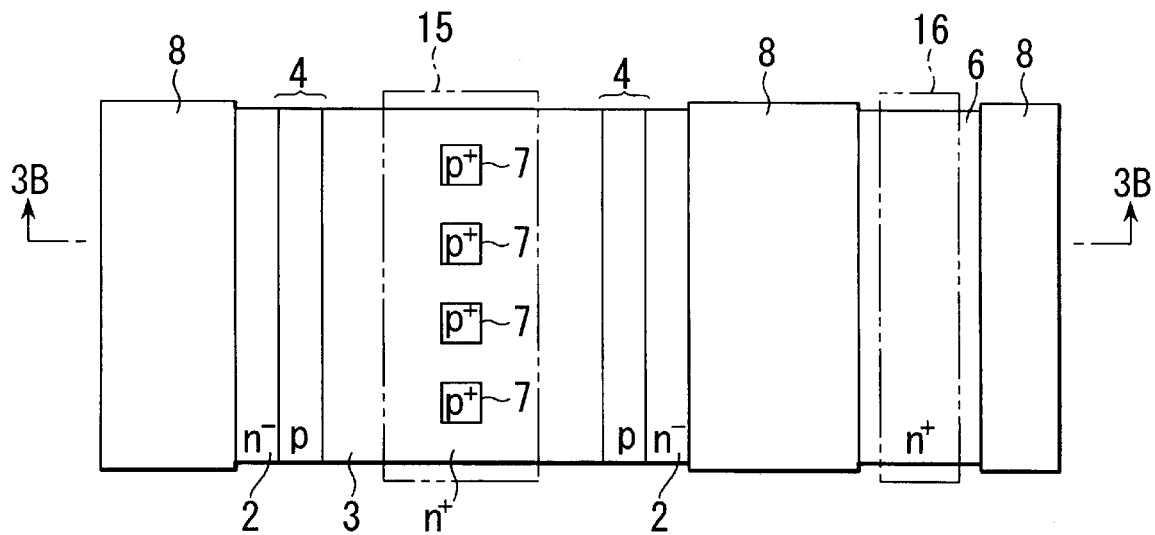
FIG. 3A is an enlarged plan view illustrating part of the planar pattern of a lateral high-breakdown-voltage MOS transistor according to a third embodiment of the invention.
Figure 3B:
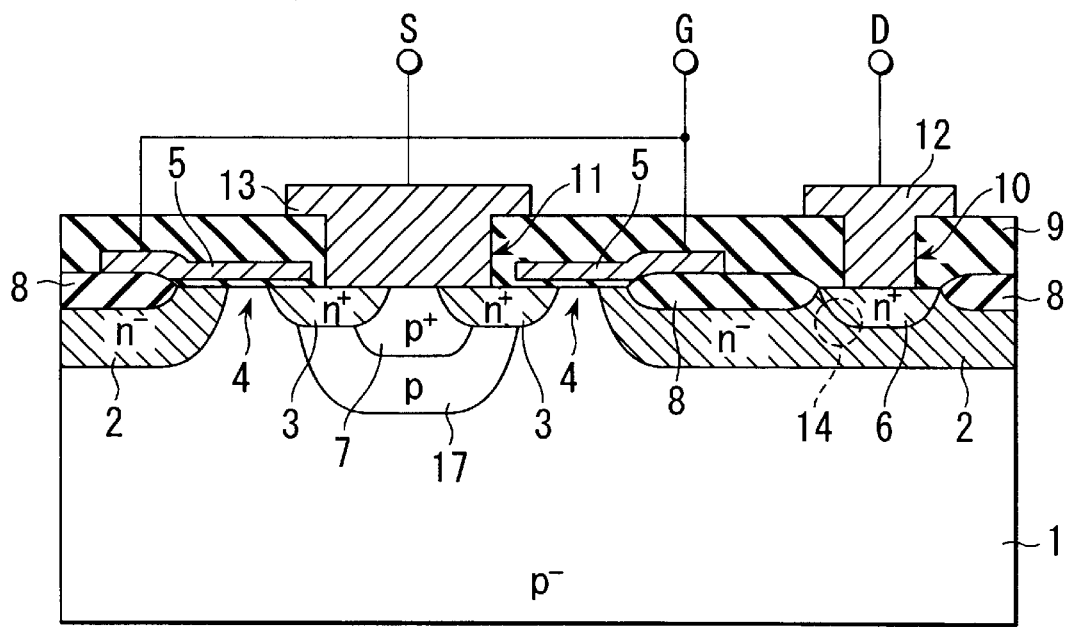
FIG. 3B is a sectional view taken along line 3B—3B of FIG. 3A.

FIG. 3A is an enlarged plan view illustrating part of the planar pattern of a lateral high-breakdown-voltage MOS transistor according to the third embodiment. FIG. 3B is a sectional view taken along line 3B—3B of FIG. 3A. In FIG. 3A, the gate electrode of the transistor is omitted.

As shown in FIGS. 3A and 3B, the third embodiment differs from the conventional MOS transistor shown in FIGS. 13A and 13B in that a p-type semiconductor region 17 having a higher impurity concentration and a lower resistance than the substrate 1 is formed in the substrate 1 in contact with the bottom surface of the source region 3.

The p-type semiconductor region 17 formed in the substrate 1 in contact with the bottom surface of the source region 3 reduces the resistance below the source region 3 as compared with the conventional MOS transistor shown in FIGS. 13A and 13B.

Accordingly, the voltage that occurs when a hole current passes below the source region 3 is reduced, and forwardly biasing of the PN junction around the source region 3 is hard to produce. As a result, a lateral parasitic bipolar transistor, which appears in the third embodiment by using the drain region 2, the substrate 1 and the source region 3 as a collector, a base and an emitter, respectively, is hard to turn on as in the first and second embodiments.

Therefore, the third embodiment provides a MOS transistor having a higher breakdown voltage than the conventional MOS transistor shown in FIGS. 13A and 13B.

Although in the third embodiment, the planar pattern of the substrate contact regions 7 is similar to that of the conventional transistor, it may be modified as in the first or second embodiment. Since in this case, the hole current flows to the source wiring 13 more easily than in the former case, the lateral parasitic bipolar transistor is harder to turn on.

The third embodiment may be modified, like the modification of the first embodiment shown in FIG. 1D, such that a p-well $1b$ is formed in a surface portion of an n silicon substrate $1a$, and an $n^+$ source region 3 and $p^+$ substrate contact regions 7 are formed in the p-well $1b$.

[Fourth Embodiment]

In a fourth embodiment, the turn-on of a lateral parasitic bipolar transistor, which appears in this embodiment, is suppressed by reducing the level of avalanche breakdown that occurs at a curved surface 14.

Figure 4A:
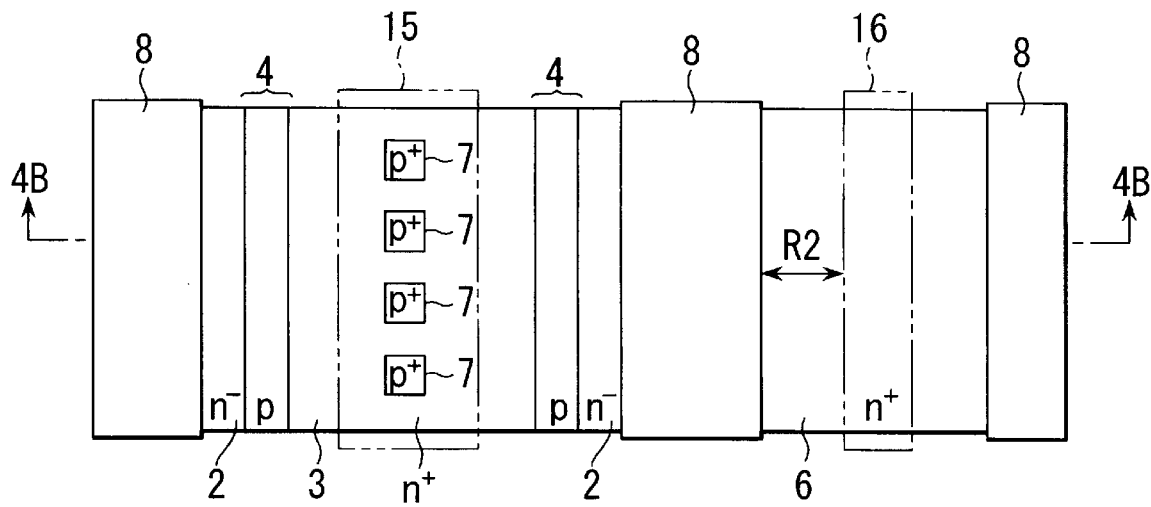
FIG. 4A is an enlarged plan view illustrating part of the planar pattern of a lateral high-breakdown—voltage MOS transistor according to a fourth embodiment of the invention.
Figure 4B:
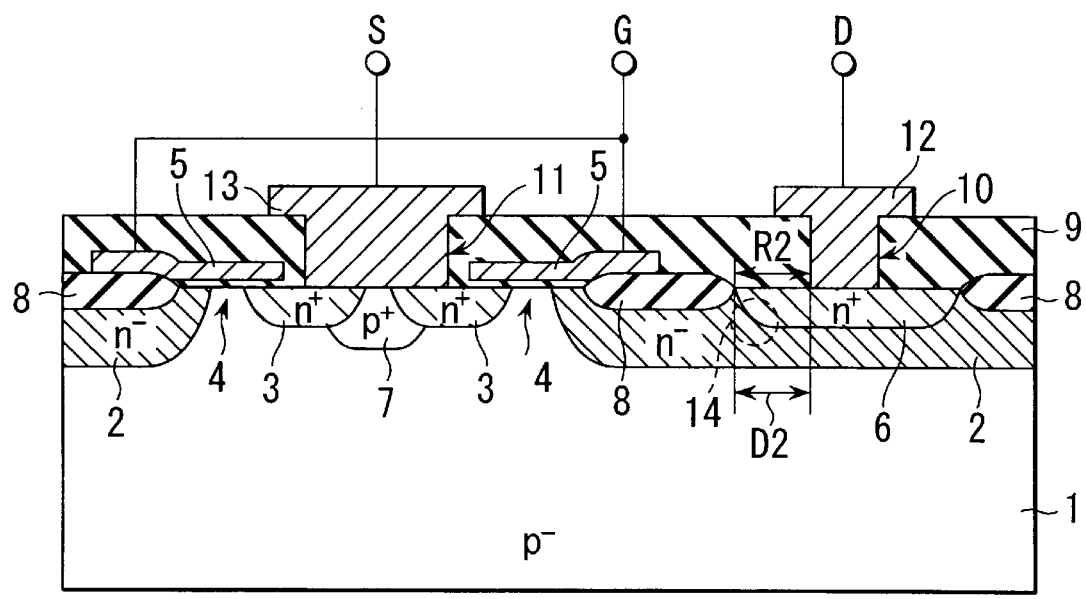
FIG. 4B is a sectional view taken along line 4B—4B of FIG. 4A.

FIG. 4A is an enlarged plan view illustrating part of the planar pattern of a lateral high-breakdown-voltage MOS transistor according to the fourth embodiment. FIG. 4B is a sectional view taken along line 4B—4B of FIG. 4A. In FIG. 4A, the gate electrode of the transistor is omitted.

As is shown in FIGS. 4A and 4B, the fourth embodiment differs from the conventional MOS transistor shown in FIGS. 13A and 13B in that the planar distance D2 between a contact surface 16 of drain wiring 12 and a drain contact region 6 and the edge of the $n^+$ source region 3 side of the drain contact region 6 is longer in the fourth embodiment than in the conventional transistor.

More specifically, the planar distance D2 is set at a value that makes, about 10Ω, the resistance R2 of a portion of the device extending from the contact surface 16 to the edge of the $n^+$ source region 3 side of the drain contact region 6.

In the fourth embodiment, the planar distance D2 between the contact surface 16 and the edge of the $n^+$ source region 3 side of the drain contact region 6 is set longer than in the conventional case, thereby weakening the electric field that occurs at the curved surface 14 of the drain contact region 6, as compared with the conventional case. Moreover, by virtue of the long planar distance D2 to the curved surface 14, the avalanche breakdown, which concentrates on the curved surface 14 in the conventional case, is not concentrated but dispersed even onto the bottom of the drain contact region 6.

Thus, the electric field applied to the curved surface 14 is reduced, and the avalanche breakdown is dispersed even onto the bottom of the drain contact region 6, thereby avoiding strong avalanche breakdown. As a result, the hole current flowing in the substrate 1 is reduced, and the lateral parasitic bipolar transistor is hard to turn on.

Therefore, the fourth embodiment also provides a lateral MOS transistor having a higher breakdown voltage than the conventional MOS transistor shown in FIGS. 13A and 13B.

Although in the fourth embodiment, the planar pattern of the substrate contact regions 7 is similar to that of the conventional transistor, it may be modified as in the first or second embodiment.

Further, the fourth embodiment may employ a p-type semiconductor region 17, as in the third embodiment, for reducing the resistance of a portion of the device below the source region 3.

Furthermore, like the modification of the first embodiment shown in FIG. 1D, the fourth embodiment may be modified such that a p-well $1b$ is formed in a surface portion of a low-concentration n silicon substrate $1a$, and an $n^+$ source region 3 and $p^+$ substrate contact regions 7 are formed in the p-well $1b$.

As described above, the planar distance D2 is set at a value that makes, about 10Ω, the resistance R2 of the portion of the device extending from the contact surface 16 to the edge of the drain contact region 6. Alternatively, the planar distance D2 may be set at a value falling within a range of 5 μm–25 μm.

The reason for setting the planar distance D2 not less than 5 μm is that the avalanche breakdown can be effectively dispersed even onto the bottom of the drain contact region 6 under this condition. The reason for setting the planar distance D2 not more than 25 μm is that if the planar distance D2 is set more than 25 μm, the planar size of the MOSFET inevitably increases, which makes it difficult to reduce the chip size.

The most preferable planar distance D2 is about 15 μm. At this time, it is more preferable if the resistance value R2 is about 10Ω.

[Fifth Embodiment]

A fifth embodiment is similar to the fourth embodiment.

Figure 5A:
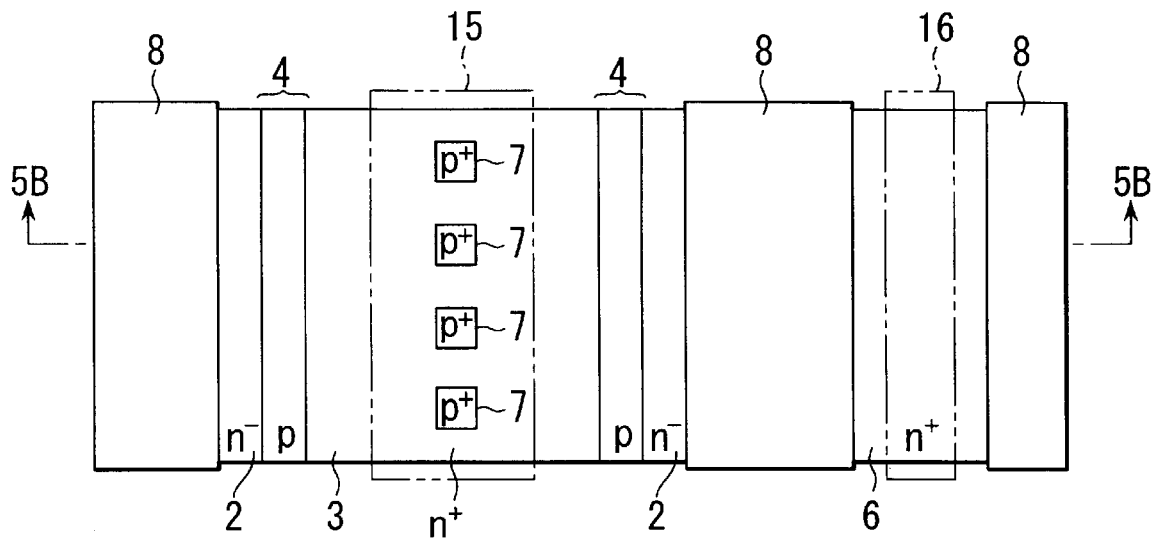
FIG. 5A is an enlarged plan view illustrating part of the planar pattern of a lateral high-breakdown-voltage MOS transistor according to a fifth embodiment of the invention.
Figure 5B:
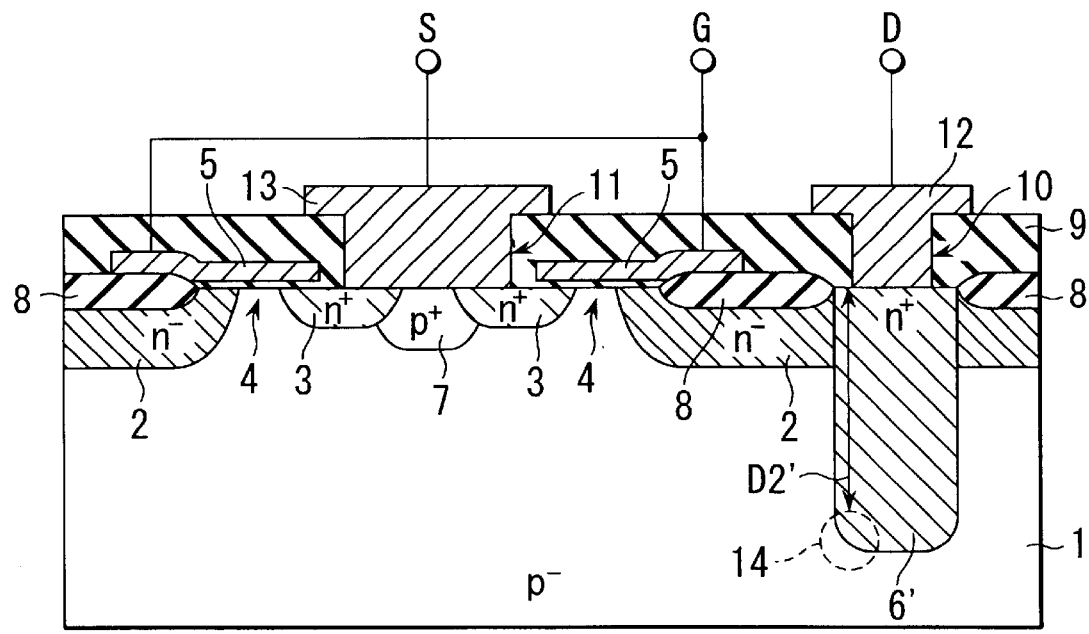
FIG. 5B is a sectional view taken along line 5B—5B of FIG. 5A.

FIG. 5A is an enlarged plan view illustrating part of the planar pattern of a lateral high-breakdown-voltage MOS transistor according to the fifth embodiment. FIG. 5B is a sectional view taken along line 5B—5B of FIG. 5A. In FIG. 5A, the gate electrode of the transistor is omitted.

As is shown in FIGS. 5A and 5B, the fifth embodiment differs from the conventional MOS transistor shown in FIGS. 13A and 13B in that, in the former, an $n^+$ deep semiconductor region 6', which has a bottom situated at a deeper level than the bottom of the drain region 2, is formed just below the contact surface 16. The deep semiconductor region 6' may be formed such that it make an addition to the drain contact region 6, or may be formed by diffusing the drain contact region 6 itself to a deeper portion of the substrate 1. As a result, the distance D2' to the curved surface 14 becomes long as in the fourth embodiment, the same advantage as obtained by the fourth embodiment can be obtained.

Moreover, it is preferable that the deep semiconductor region 6' contains a sufficient amount of an n-type impurity such as arsenic or phosphor, etc. More preferably, the total amount of the n-type impurity is set at, for example, $3 \times 10^{12}$ cm$^{-2}$ or more.

If the deep semiconductor region 6' contains a sufficient amount of the n-type impurity, all the region 6' is not depleted and its deep portion remains when a surge voltage is applied to the region via the drain wiring 12. Where a deep portion of the region 6' remains, the electric field can be more effectively reduced as compared with a case where all the region 6' is depleted.

Although in the fifth embodiment, the planar pattern of the substrate contact regions 7 are similar to that employed in the conventional transistor, it may be formed similar to that employed in the first or second embodiment.

Furthermore, a p-type semiconductor region 17 for reducing the resistance of portions located under the source region 3 may be provided as in the third embodiment.

Also, the fifth embodiment can be combined with the fourth embodiment.

Figure 6:
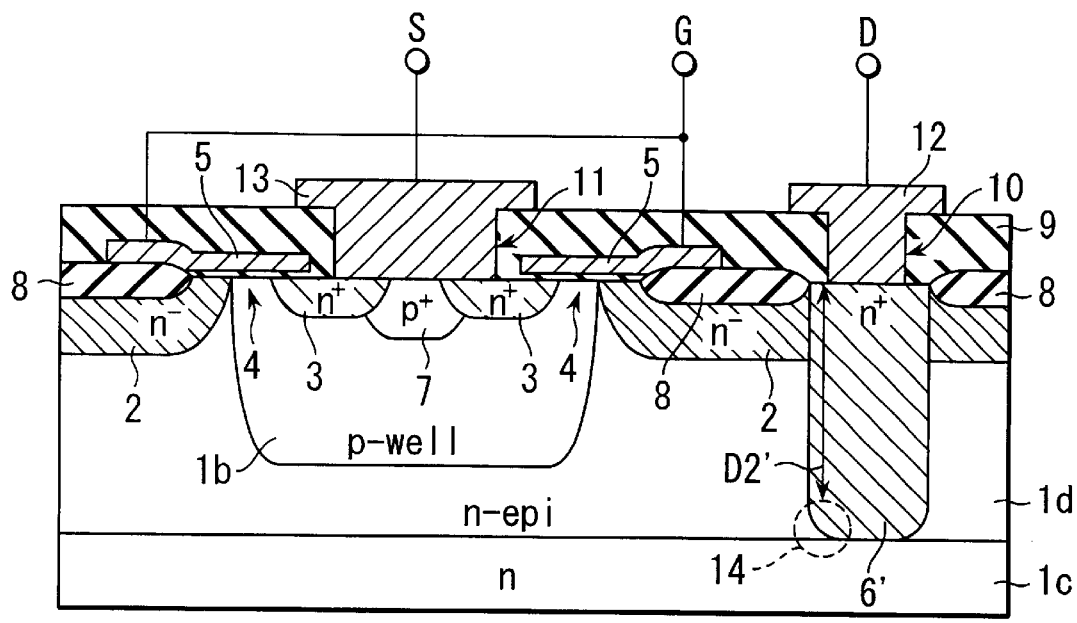
FIG. 6 is a sectional view illustrating another structure of the lateral high-breakdown-voltage MOS transistor according to the fifth embodiment of the invention.
Figure 10:
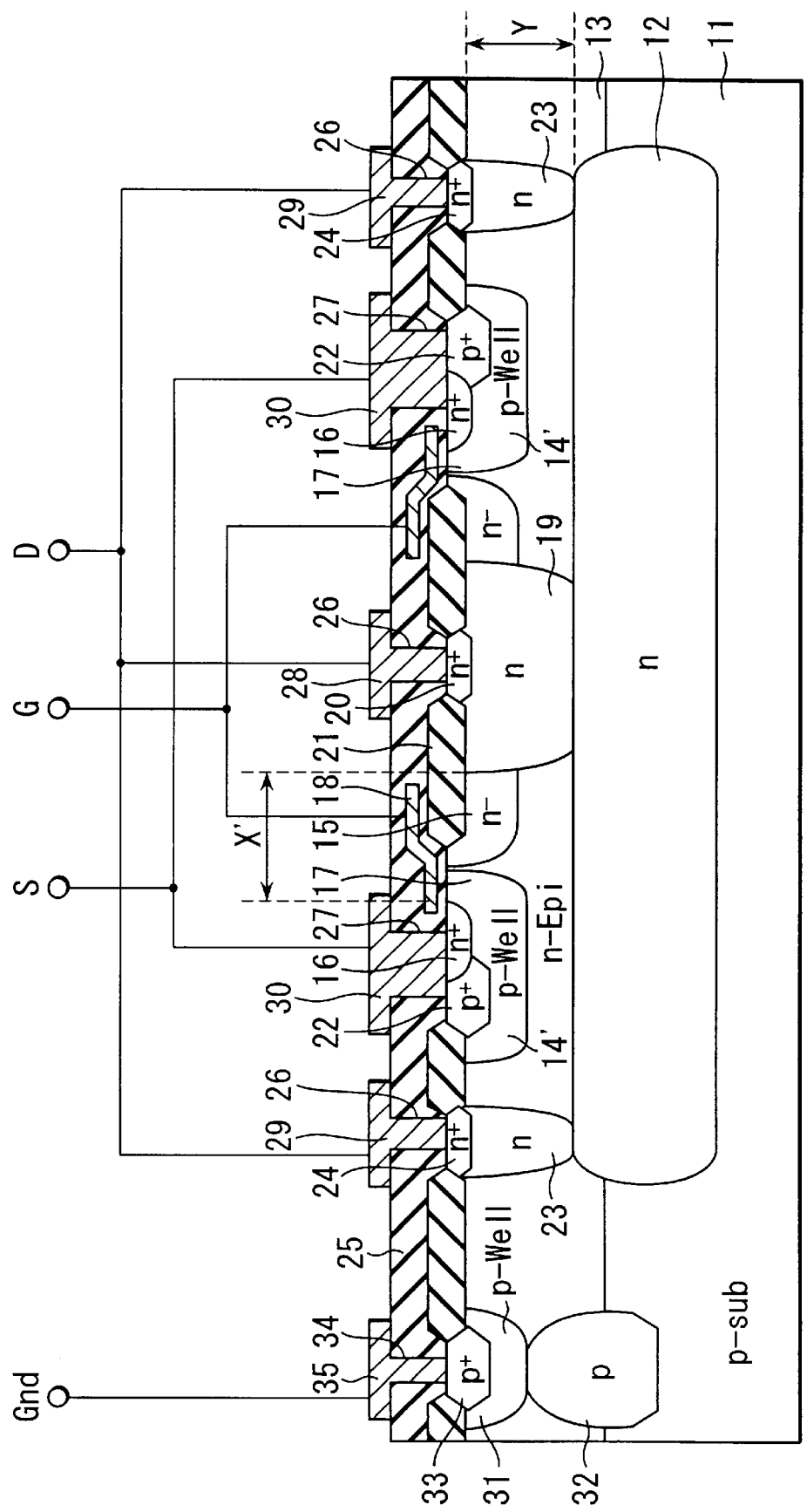
FIG. 10 is a sectional view illustrating a lateral high-breakdown-voltage MOS transistor according to an eighth embodiment of the invention.

In addition, the fifth embodiment may have the structure of an n-type buried layer 1c formed in the substrate, as shown in FIG. 6. In this case, n-type semiconductor layer, for example, an n-type epitaxial layer 1d is formed on the n-type buried layer 1c, and the p-well layer 1b as with first embodiment shown in FIG. 10 is formed in a surface portion of the epitaxial layer 1d. The $n^+$ source region 3 and the $p^+$ substrate contact regions 7 are formed in the p-well layer 1b, and the deep semiconductor region 6' is formed in contact with the buried layer 1c. This structure can provide the same advantage as the aforementioned one. Further, the parasitic transistor that appears in the structure is harder to turn on since the hole current easily flows to the buried layer 1c. The drain region 2 may be formed in the p-well layer 1b, as well as the $n^+$ source region 3 and the $p^+$ substrate contact regions 7.

[Sixth Embodiment]

Figure 7A:
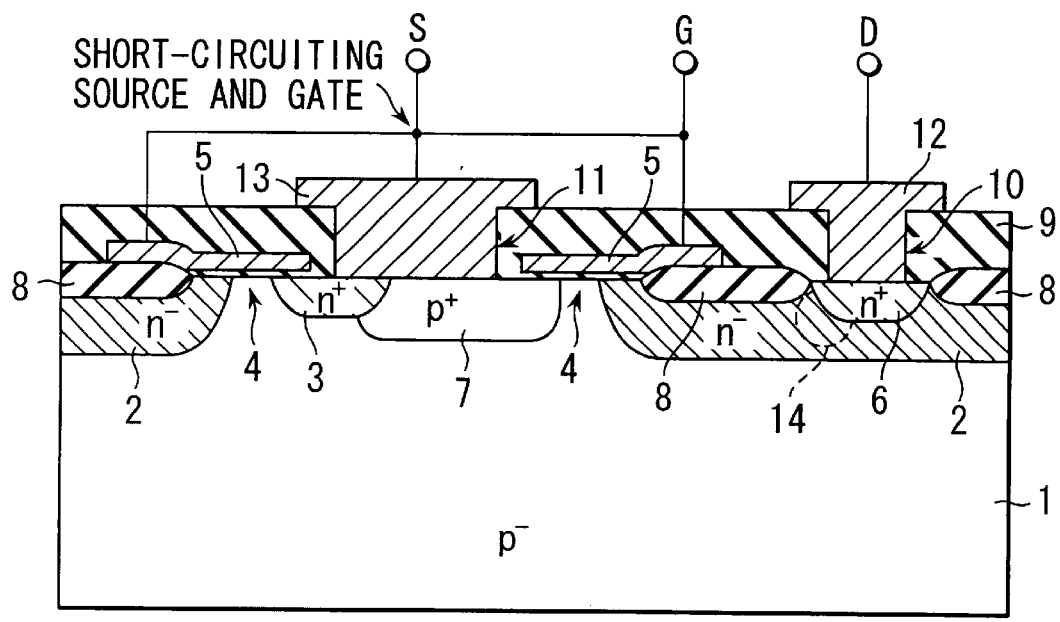
FIG. 7A is a sectional view illustrating a lateral high-breakdown-voltage MOS transistor according to a sixth embodiment of the invention.

FIG. 7A is a sectional view illustrating a lateral high-breakdown-voltage MOS transistor according to a sixth embodiment of the invention.

In the first to fifth embodiments, the lateral high-breakdown-voltage MOS transistor is formed by connecting the drain wiring 12, the source wiring 13 and the gate electrode 5 to the drain terminal D, the source terminal S and the gate terminal G, respectively.

However, the lateral high-breakdown-voltage MOS transistor can be made to function as a diode by short-circuiting the source wiring 13 and the gate electrode 5 as shown in FIG. 7A.

Figure 7B:
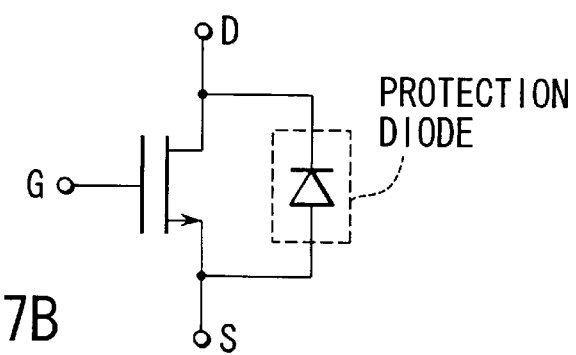
FIG. 7B is a view of an equivalent circuit indicating a lateral high-breakdown-voltage MOS transistor used as a protection diode.

When using the transistor as a diode, it is desirably used as a protection diode. FIG. 7B shows an example of connection of the protection diode. As shown in FIG. 7B, the cathode and the anode of the protection diode are connected to the drain terminal D and the source terminal S of the lateral high-breakdown-voltage MOS transistor, respectively. In the protection diode, breakdown occurs when a surge voltage is applied to the drain terminal D of the lateral high-breakdown-voltage MOS transistor, thereby releasing the surge voltage through the source terminal S.

Thus, the lateral high-breakdown-voltage MOS transistor of the invention can be also used as a diode by short-circuiting the source wiring 13 and the gate electrode 5.

Accordingly, where a plurality of lateral high-breakdown-voltage MOS transistors according to the invention are formed in a chip, some of them can be used as switching elements, and the others can be used as protection diodes for the MOS transistors.

In this case, the MOS transistors themselves have a high breakdown voltage as in the first to fifth embodiments, and furthermore protection diodes are connected to the transistors. Therefore, the transistors can have a yet higher breakdown voltage.

Since the protection diodes do not require a change in each semiconductor region pattern formed in the chip, they can be formed simply by modifying wiring formed in each semiconductor region.

Although FIG. 7A shows a case where the lateral high-breakdown-voltage MOS transistor of the first embodiment is made to function as a diode, the lateral high-breakdown-voltage MOS transistor according to each of the second to fifth embodiments can be made to function as a diode by short-circuiting the source wiring 13 and the gate electrode 5.

[Seventh Embodiment]

A seventh embodiment is an improvement of the fifth embodiment shown in FIG. 6.

The MOS transistor of the seventh embodiment is characterized not only in that a deep diffusion layer extending from a substrate surface portion of the drain section to the buried layer as in the fifth embodiment, but also in that a distance X' between the deep diffusion layer and the source region is greater than the thickness Y of the epitaxial layer provided on the buried layer, and is set at a value that does not interrupt microfabrication of the element. This enables more concentration of an electric field in the depth direction (i.e. the Y direction) than in the lateral direction (i.e. the X direction), and increase of capacitance between the source and the drain. As a result, the breakdown voltage of the MOS transistor is enhanced.

Figure 8:
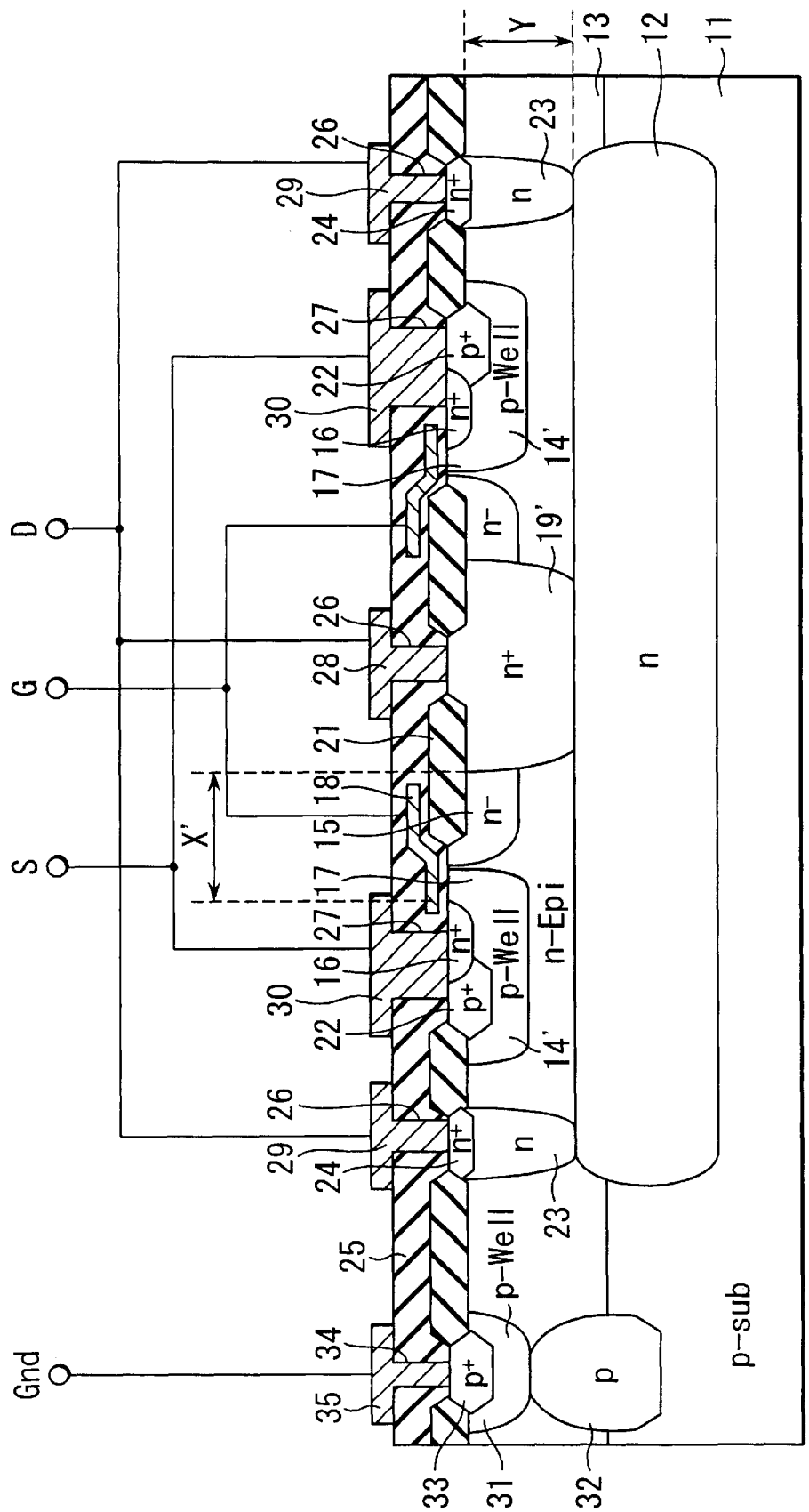
FIG. 8 is a sectional view illustrating a lateral high-breakdown-voltage MOS transistor according to a seventh embodiment of the invention.

FIG. 8 is a sectional view illustrating a lateral high-breakdown-voltage MOS transistor according to the seventh embodiment.

Specifically, as shown in FIG. 8, an n-type buried layer 12 is formed in a p-type semiconductor substrate 11, and an n-type epitaxial layer 13 is formed on the buried layer 12 by epitaxial growth. A p-well layer 14' is formed in a surface portion of the epitaxial layer 13, and a high-concentration $n^+$ source region 16 is formed in a surface portion of the p-well layer 14'. A substrate contact region 22 is formed in the well layer 14' in contact with the source region 16.

A low-concentration $n^-$ drain region 15 is formed in a surface portion of the epitaxial layer 13, separated from the well layer 14'. A deep high-concentration n-type diffusion layer 19' is formed in the drain region 15, extending from the surface of the substrate 11 to the buried layer 12. In other words, the diffusion layer 19' reaches a level deeper than the bottom of the drain region 15. Since the deep diffusion layer 19' also serves as a drain contact region, it is a high-concentration $n^+$ diffusion layer. It is desirable that the concentration of the deep diffusion layer 19' should be from $3.0 \times 10^{12}$ cm$^{-3}$ to $5.0 \times 10^{15}$ cm$^{-3}$. If it is $3.0 \times 10^{12}$ cm$^{-3}$ or more, depletion of the entire deep diffusion layer 19' is avoided when a surge voltage is applied thereto. If, on the other hand, it is $5.0 \times 10^{15}$ cm$^{-3}$ or less, occurrence of a leak current is suppressed.

A gate electrode 18 is formed on the semiconductor substrate 11 between the drain region 15 and the source region 16, i.e. on a channel 7, isolated from the substrate 11. A field insulating film 21 is formed on the drain region 15.

An n-type isolating diffusion layer 23 is formed around the well layer 14' with a space interposed therebetween. The diffusion layer 23 extends to an end portion of the buried layer 12. An $n^+$ drain contact region 24 having a higher impurity concentration than the isolating diffusion layer 23 is formed on the diffusion layer 23.

An interlayer insulating film 25 is formed on the field insulating film 21 and on the various semiconductor regions. The interlayer insulating film 25 has contact holes 26 that expose the deep diffusion layer 19 and the drain contact region 24, and a contact hole 27 that exposes the source region 16 and the substrate contact region 22.

On the interlayer insulating film 25, there are provided first and second drain electrodes 28 and 29 that contact the deep diffusion layer 19 and the drain contact region 24 through the contact holes 26, respectively, and a source electrode 30 that touches the source region 16 and the substrate contact region 22 through the contact hole 27. The first drain electrode 28 is electrically connected to the drain region 15 via the deep diffusion layer 19', while the source electrode 30 is electrically connected to the well layer 14' via the substrate contact region 22. Further, the second drain electrode 29 is electrically connected to the first drain electrode 28 via the drain contact region 24, the isolating diffusion layer 23, the buried layer 12 and the deep diffusion layer 19'.

A p-well layer 31 is formed at a distance from the isolating diffusion layer 23, and a p-type buried layer 32 that connects the well layer 31 to the semiconductor substrate 11 is formed. A $p^+$ ground contact region 33 having a higher impurity concentration than the well layer 31 is formed on the well layer 31. A ground electrode 35 is formed on the interlayer insulating film 25 such that it comes into contact with the ground contact region 33 via a contact hole 34 formed in the insulating film 25.

In the seventh embodiment constructed as the above, a distance between the source and the drain, i.e. a distance X' between the $n^+$ deep diffusion layer 19' and the $n^+$ source region 16 is greater than the thickness Y of the epitaxial layer 13 provided on the buried layer 12 (X'>Y), and is set at a value that does not interrupt microfabrication of the element. Specifically, it is desirable that the distance X' should be set at a value 10%–50% greater than the thickness Y.

As described above, according to the seventh embodiment, in the lateral power MOSFET surrounded by an n-type diffusion layer that comprises the buried layer 12, the isolating diffusion layer 23 and the drain contact region 24, the distance X' between the deep diffusion layer 19' and the source region 16 is greater than the thickness Y of the epitaxial layer 13 provided on the buried layer 12, and is set at a value that does not interrupt microfabrication of the element.

Accordingly, when a surge voltage has been applied to the transistor via the first drain electrode 28, a resultant surge current is made to mainly flow in the direction of the thickness Y than in the direction parallel to the distance X'. As a result, more concentration of an electric field occurs in the direction of the thickness Y than in the lateral direction, and hence avalanche breakdown occurs in the n-type buried layer 12. In other words, avalanche breakdown in the lateral direction is suppressed, and therefore only a small amount of a hole current flows in the well layer 14'. This makes it difficult to turn on the lateral parasitic bipolar transistor, thereby increasing the breakdown voltage of the transistor element.

Moreover, since a high-concentration n-type deep diffusion layer 19' extends from the surface of the substrate 11 in the drain section to the buried layer 12, capacitance between the source and the drain increases. Therefore, when a surge voltage has been applied to the transistor via the first drain electrode 28, it can sufficiently be charged between the source and the drain, thereby suppressing the influence of the surge voltage. In other words, the breakdown voltage of the MOS transistor is further enhanced.

Furthermore, since the concentration of the deep diffusion layer 19' is controlled such as depletion of the entire deep diffusion layer 19' is avoided when a surge voltage is applied thereto, thereby suppressing the concentration of an electric field of the surge voltage.

In addition, since the deep diffusion layer 19' also serves as a drain contact region, it is not necessary to form a drain contact region itself, which makes the impurity profile of the drain section uniform and accordingly suppresses concentration of an electric field.

The seventh embodiment is not limited to the above-described structure, but may be modified as follows.

Figure 9:
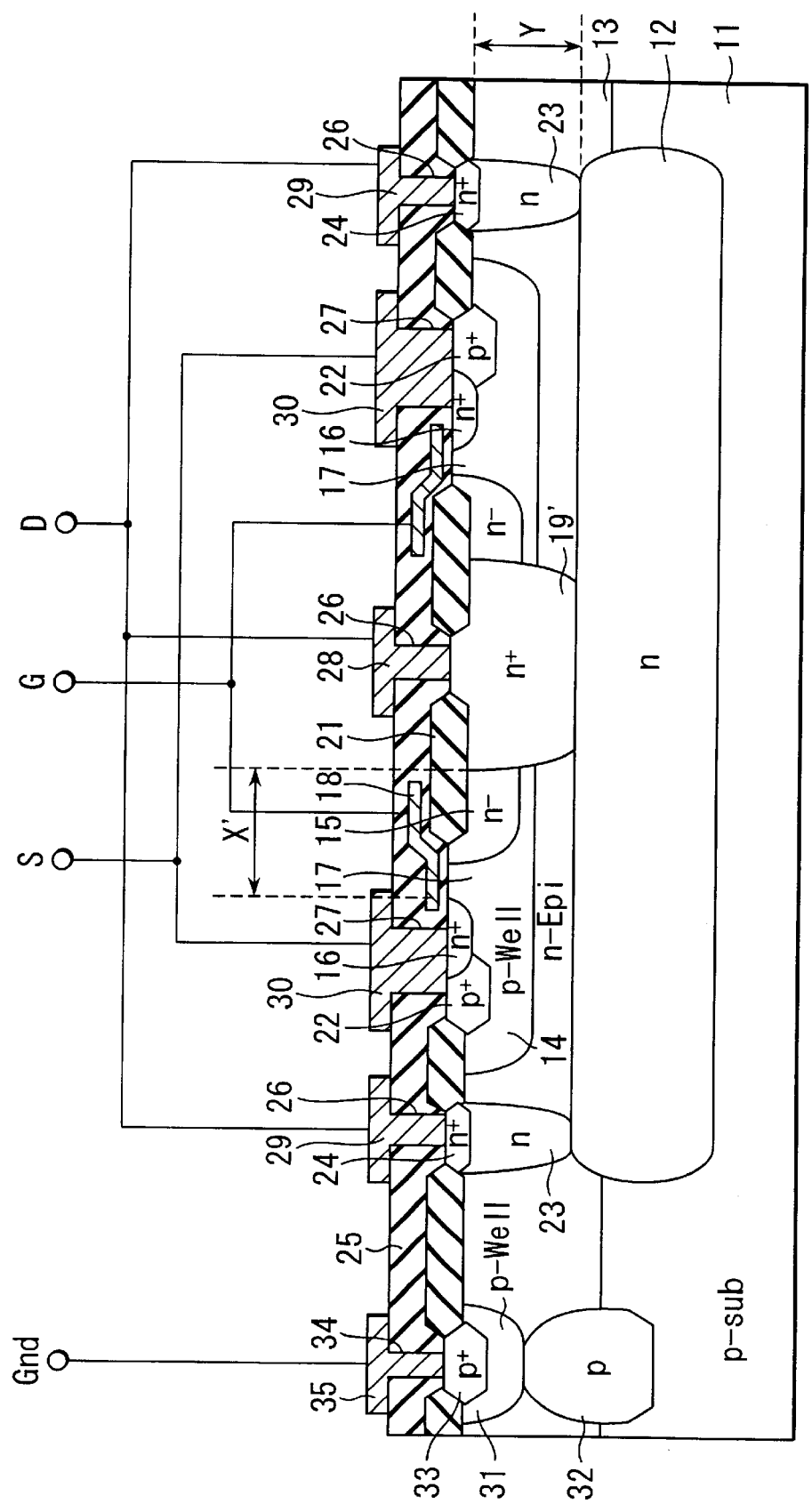
FIG. 9 is a sectional view illustrating another structure of the lateral high-breakdown-voltage MOS transistor according to the seventh embodiment of the invention.

FIG. 9 shows another structure that may be employed in the seventh embodiment. As shown in FIG. 9, the drain region 15 may be formed in the p-well layer 14 of the device, as well as the source region 16 and the substrate contact region 22.

In this case, the same advantage as obtained by the seventh embodiment can be obtained, and also the resistance of the element can be reduced since the current path is formed in a reliable manner and prevented from extending to the epitaxial layer 13. This being so, even when the distance X' between the deep diffusion layer 19' and the source region 16 is greater than the thickness Y of the epitaxial layer 13 provided on the buried layer 12, degradation of the element performance due to the fact that the distance X' is greater than the thickness Y is prevented.

Also, since it is not necessary to form a plurality of p-well layers 14' as shown in FIG. 8, the device can be manufactured more easily.

[Eighth Embodiment]

An eighth embodiment differs from the seventh embodiment only in that, in the former, a drain contact region is formed in a surface portion of a deep diffusion layer as employed in the seventh embodiment. A description will be given only of this different structure.

FIG. 10 is a sectional view illustrating a lateral high-breakdown-voltage MOS transistor according to the eighth embodiment.

As shown in FIG. 10, the eighth embodiment differs from the seventh embodiment only in that, in the former, an $n^+$ drain contact region 20 having a higher impurity concentration than a deep diffusion layer 19 is formed on a surface portion thereof.

The eighth embodiment has the same advantage as the seventh embodiment.

The eighth embodiment is not limited to the above structure, but may be modified as follows.

Figure 11:
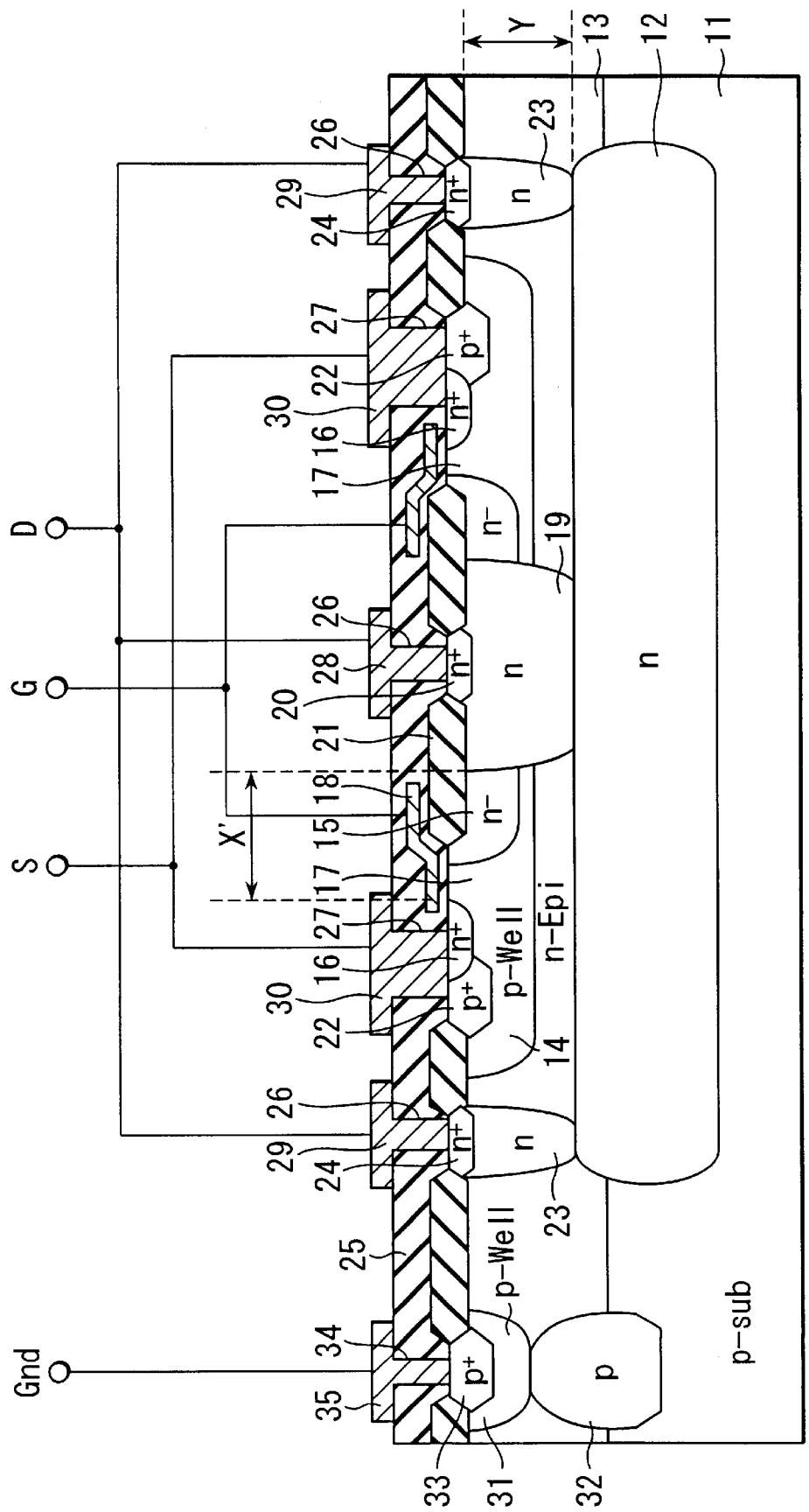
FIG. 11 is a sectional view illustrating another structure of the lateral high-breakdown-voltage MOS transistor according to the eighth embodiment of the invention.

FIG. 11 shows another structure that may be employed in the eighth embodiment. As shown in FIG. 11, the drain region 15 may be formed in the p-well layer 14 of the device, as well as the source region 16 and the substrate contact region 22.

In this case, the same advantage as obtained by the eighth embodiment can be obtained, and also the resistance of the element can be reduced since the current path is formed in a reliable manner and prevented from extending to the epitaxial layer 13. This being so, even when the distance X' between the deep diffusion layer 19 and the source region 16 is greater than the thickness Y of the epitaxial layer 13 provided on the buried layer 12, degradation of the element performance due to the fact that the distance X' is greater than the thickness Y is prevented.

Also, since it is not necessary to form a plurality of p-well layers 14' as shown in FIG. 10, the device can be manufactured more easily.

[Ninth Embodiment]

A ninth embodiment differs from the eighth embodiment shown in FIG. 11 only in that, the former does not have a deep diffusion layer as employed in the eighth embodiment. A description will be given only of a structure different from that of the eighth embodiment.

Figure 12:
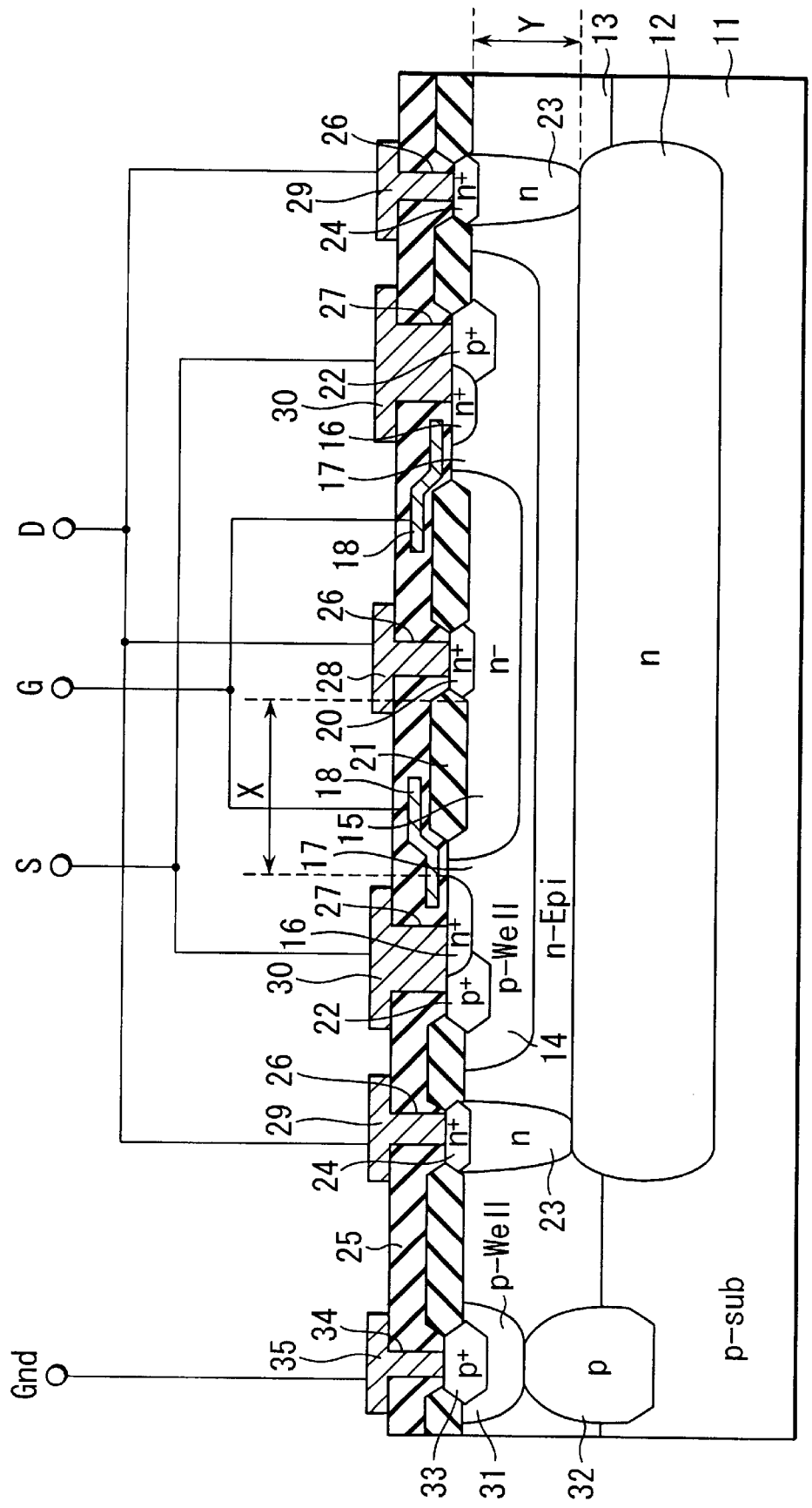
FIG. 12 is a sectional view illustrating a lateral high-breakdown-voltage MOS transistor according to a ninth embodiment of the invention.

FIG. 12 is a sectional view illustrating a lateral high-breakdown-voltage MOS transistor according to the ninth embodiment.

As shown in FIG. 12, the ninth embodiment differs from the eighth embodiment shown in FIG. 11 only in that, in the former, an $n^+$ drain contact region 20 having a higher impurity concentration than the drain region 15 is formed in a surface portion of the drain region 15, and no deep diffusion layer 19 is formed.

In the ninth embodiment, a distance between the source and the drain, i.e. a distance X between the $n^+$ drain contact region 20 and the $n^+$ source region 16 is greater than a distance between the drain and the buried layer, i.e. the thickness Y of the epitaxial layer 13 provided on the buried layer 12 (X>Y), and is set at a value that does not interrupt microfabrication of the element. Specifically, it is desirable that the distance X should be set at a value 10%–50% greater than the thickness Y.

According to the ninth embodiment, in the lateral power MOSFET surrounded by an n-type diffusion layer that comprises the buried layer 12, the isolating diffusion layer 23 and the drain contact region 24, the distance X between the drain contact region 20 and the source region 16 is greater than the thickness Y of the epitaxial layer 13 on the buried layer 12, and is set at a value that does not interrupt microfabrication of the element.

Accordingly, when a surge voltage has been applied to the transistor via the first drain electrode 28, a resultant surge current is made to mainly flow in the direction of the thickness Y than in a direction parallel to the distance X. As a result, more concentration of an electric field occurs in the direction of the thickness Y than in the lateral direction, and hence avalanche breakdown occurs in the n-type buried layer 12. In other words, electric field concentration at a curved surface of the drain contact region 20 reduces and avalanche breakdown in the lateral direction is suppressed. Accordingly, only a small amount of a hole current flows in the p-well layer 14, which makes it difficult to turn on the lateral parasitic bipolar transistor. As a result, the breakdown voltage of the transistor element increases.

Moreover, in the device, the drain region 15 and the source region 16 are formed in the p-well layer 14. Therefore, the current path is formed in a reliable manner and prevented from extending to the epitaxial layer 13, thereby reducing the resistance of the element. This being so, even when the distance X between the drain contact region 20 and the source region 16 is greater than the thickness Y of the epitaxial layer 13 on the buried layer 12, degradation of the element performance due to the fact that the distance X is greater than the thickness Y is prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a lateral high-breakdown-voltage transistor comprising:

a first-conductivity-type semiconductor substrate;

a second-conductivity-type buried layer formed in the semiconductor substrate;

a second-conductivity-type epitaxial layer formed on the buried layer;

a first-conductivity-type well layer formed in a surface portion of the epitaxial layer;

a second-conductivity-type source region formed in a surface portion of the well layer;

a second-conductivity-type drain region formed in a surface portion of the epitaxial layer or the well layer, separated from the source region;

a second-conductivity-type deep diffusion layer formed in the drain region but extending to a level lower than a bottom of the drain region in contact with the buried layer, and having a higher impurity concentration than the drain region;

a gate electrode formed above the well layer between the drain region and the source region, insulated from the well layer;

a first drain electrode formed on the deep diffusion layer and electrically connected to the drain region via the deep diffusion layer;

a source electrode formed on and electrically connected to the source region;

a second-conductivity-type isolating diffusion layer surrounding the drain region and the source region, separated from the well layer, and extending to the buried layer; and a second drain electrode formed on the isolating diffusion layer and electrically connected to the first drain electrode, a distance between the deep diffusion layer and the source region being greater than a thickness of the epitaxial layer on the buried layer.

2. The semiconductor device having the lateral high-breakdown-voltage transistor according to claim 1, wherein the drain region is formed in the well layer.

3. The semiconductor device having the lateral high-breakdown-voltage transistor according to claim 1, wherein the distance is 10%–50% greater than the thickness.

4. The semiconductor device having the lateral high-breakdown-voltage transistor according to claim 1, wherein the deep diffusion layer has an impurity concentration ranging from $3.0 \times 10^{12}$ cm$^{-3}$ to $5.0 \times 10^{15}$ cm$^{-3}$.

5. The semiconductor device having the lateral high-breakdown-voltage transistor according to claim 1, further comprising a second-conductivity-type drain contact region formed in a surface portion of the deep diffusion layer and having a higher impurity concentration than the deep diffusion layer.

6. A semiconductor device having a lateral high-breakdown-voltage transistor comprising:

a first-conductivity-type semiconductor substrate;

a second-conductivity-type buried layer formed in the semiconductor substrate;

a second-conductivity-type epitaxial layer formed on the buried layer;

a first-conductivity-type well layer formed in a surface portion of the epitaxial layer;

a second-conductivity-type source region formed in a surface portion of the well layer;

a second-conductivity-type drain region formed in a surface portion of the well layer, separated from the source region;

a second-conductivity-type drain contact region formed in a surface portion of the drain region and having a higher impurity concentration than the drain region;

a gate electrode formed above the well layer between the drain region and the source region, insulated from the well layer;

a first drain electrode formed on the drain contact region and electrically connected to the drain region via the drain contact region;

a source electrode formed on and electrically connected to the source region;

a second-conductivity-type isolating diffusion layer surrounding the well layer, separated from the well layer, and extending to the buried layer; and a second drain electrode formed on the isolating diffusion layer and electrically connected to the first drain electrode, a distance between the drain contact region and the source region being greater than a thickness of the epitaxial layer on the buried layer.

7. The semiconductor device having the lateral high-breakdown-voltage transistor according to claim 6, wherein the distance is 10%–50% greater than the thickness.

* * * * *